2020年8月11日

(12) United States Patent
Wu et al.

(10) Patent No.: US 10,741,112 B2
(45) Date of Patent: Aug. 11, 2020

(54) DISPLAY APPARATUS AND PROTECTION CIRCUIT THEREOF

(71) Applicant: AU Optronics Corporation, Hsin-Chu (TW)

(72) Inventors: Jian-Yu Wu, Hsin-Chu (TW); Shih-Hsuan Chen, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 402 days.

(21) Appl. No.: 15/912,690

(22) Filed: Mar. 6, 2018

(65) Prior Publication Data
US 2018/0330650 A1 Nov. 15, 2018

(30) Foreign Application Priority Data

May 11, 2017 (TW) .............................. 106115646 A

(51) Int. Cl.
*G09G 3/00* (2006.01)
*H01L 27/02* (2006.01)
*G02F 1/1362* (2006.01)

(52) U.S. Cl.
CPC ....... *G09G 3/006* (2013.01); *G02F 1/136204* (2013.01); *H01L 27/0255* (2013.01); *H01L 27/0266* (2013.01); *G02F 2201/50* (2013.01); *G09G 2310/0289* (2013.01); *G09G 2330/04* (2013.01); *G09G 2330/045* (2013.01); *G09G 2330/08* (2013.01); *G09G 2330/12* (2013.01)

(58) Field of Classification Search
CPC .............. G09G 3/006; G02F 1/136204; H01L 27/0255; H01L 27/0266
See application file for complete search history.

(56) References Cited

U.S. PATENT DOCUMENTS

| 7,889,011 B2 | 2/2011 | Nyboe et al. |
| 8,248,327 B2 | 8/2012 | Kuranuki et al. |
| 2014/0333596 A1* | 11/2014 | Yang .................. G09G 3/3275 345/209 |

(Continued)

FOREIGN PATENT DOCUMENTS

| CN | 102402969 | 4/2012 |
| TW | I557709 | 6/2017 |

*Primary Examiner* — Scott Bauer
(74) *Attorney, Agent, or Firm* — WPAT, PC

(57) ABSTRACT

A protection circuit is disclosed, applied to a display apparatus. The display apparatus includes a voltage level shifter and a plurality of clock signal lines coupled to the voltage level shifter. The protection circuit includes a plurality of switches. At least one of the switches includes a control terminal, an input terminal, and an output terminal. The control terminal is coupled to a first clock signal line in the clock signal lines. The input terminal is coupled to a second clock signal line in the clock signal lines. The control terminal determines, according to a first clock signal provided by the first clock signal line, whether to conduct the input terminal and the output terminal, and the output terminal outputs a second clock signal provided by the second clock signal line. The output terminals of the switches are coupled to a node, and when the first clock signal line and the second clock signal line are short-circuited, the first clock signal and the second clock signal are pulled down as low-level signals, and the node outputs a protection signal.

10 Claims, 4 Drawing Sheets

(56) References Cited

U.S. PATENT DOCUMENTS

| | | | |
|---|---|---|---|
| 2015/0009599 A1* | 1/2015 | Zhang | H02H 3/28 |
| | | | 361/87 |
| 2015/0041849 A1 | 2/2015 | Gillberg et al. | |
| 2015/0339981 A1* | 11/2015 | Liu | G09G 3/3225 |
| | | | 345/212 |
| 2016/0148922 A1* | 5/2016 | Kim | H01L 27/0255 |
| | | | 361/56 |
| 2017/0256222 A1* | 9/2017 | Kuo | G09G 3/3677 |

* cited by examiner

DISPLAY APPARATUS AND PROTECTION CIRCUIT THEREOF

BACKGROUND

Technical Field

The present disclosure relates to a display apparatus, and in particular, to a display apparatus having a protection circuit.

Related Art

In a display technology, there are several solutions for short circuit protection, such as over current protection (OCP), short circuit protection (SCP), and a current limiting resistor. When the OCP solution is used, it is difficult to set a protection point thereof. If the protection point is set extremely low, a faulty contact easily occurs, causing starting of the protection mechanism. On the contrary, if the protection point is set extremely high, the protection mechanism is likely not normally started even if a short-circuit already occurs in a display.

In addition, when the SCP solution is used, because the mechanism thereof is to detect a voltage level of an output path by using a shift register, once a position in which a short-circuit occurs is extremely distant from a shift register, the protection mechanism may not be effectively started ultimately due to trace impedance. Moreover, when the current limiting resistor solution is used, although the current limiting resistor can effectively limit a pump load current when a short-circuit occurs, because resistance of the current limiting resistor is relatively large, a signal is easily affected and current limiting cannot be effectively performed.

As can be seen from this, the foregoing existing manner apparently still has inconvenience and disadvantages, and is yet to be improved. To mitigate the foregoing problem, people in the related field all painstakingly strive for a solution. However, there has not been any proper solution for a long time.

SUMMARY

An objective of the Summary is to provide a brief summary of the present disclosure, so that a read can have a basic understanding of the present disclosure. The Summary is not a complete overview of the present disclosure, and it is not intended to specify important/key elements of embodiments of the present disclosure or to limit the scope of the present disclosure.

An objective of the present disclosure is to provide a display apparatus and a protection circuit thereof, to mitigate the problem in the related art.

To achieve the foregoing objective, a technical aspect of the present disclosure relates to a protection circuit, applied to a display apparatus. The display apparatus includes a voltage level shifter and a plurality of clock signal lines coupled to the voltage level shifter. The protection circuit includes a plurality of switches. At least one of the switches includes a control terminal, an input terminal, and an output terminal. The control terminal is coupled to a first clock signal line in the clock signal lines. The input terminal is coupled to a second clock signal line in the clock signal lines. The control terminal determines, according to a first clock signal provided by the first clock signal line, whether to conduct the input terminal and the output terminal, and the output terminal outputs a second clock signal provided by the second clock signal line. The output terminals of the switches are coupled to a node, and when the first clock signal line and the second clock signal line are short-circuited, the first clock signal and the second clock signal are pulled down as low-level signals, and the node outputs a protection signal.

To achieve the foregoing objective, another technical aspect of the present disclosure relates to a display apparatus. The display apparatus includes a control circuit, a voltage level shifter, a plurality of clock signal lines, a protection circuit, and a comparator circuit. The control circuit is disposed on a first side of the display apparatus. The voltage level shifter is disposed on the first side of the display apparatus and is coupled to the control circuit. A first end of each of the clock signal lines is coupled to the voltage level shifter. The protection circuit is disposed on a second side of the display apparatus opposite to the first side and is coupled to a second end of each of the clock signal lines. When the clock signal lines are short-circuited, the protection circuit provides a protection signal for the comparator circuit by using a feedback line, and the comparator circuit outputs a shutdown signal according to the protection signal, to turn off a power supply of the control circuit or a power supply of the voltage level shifter.

After referring to the following implementations, a person or ordinary skill in the art of the present disclosure can readily understand the basic spirit and other objectives of the present disclosure, and the technical means and implementation aspects used in the present disclosure.

BRIEF DESCRIPTION OF THE DRAWINGS

The make the foregoing and other objectives, features, advantages, and embodiments of the present disclosure clearer and more comprehensible, the accompanying drawings are described as follows.

Figure 1:
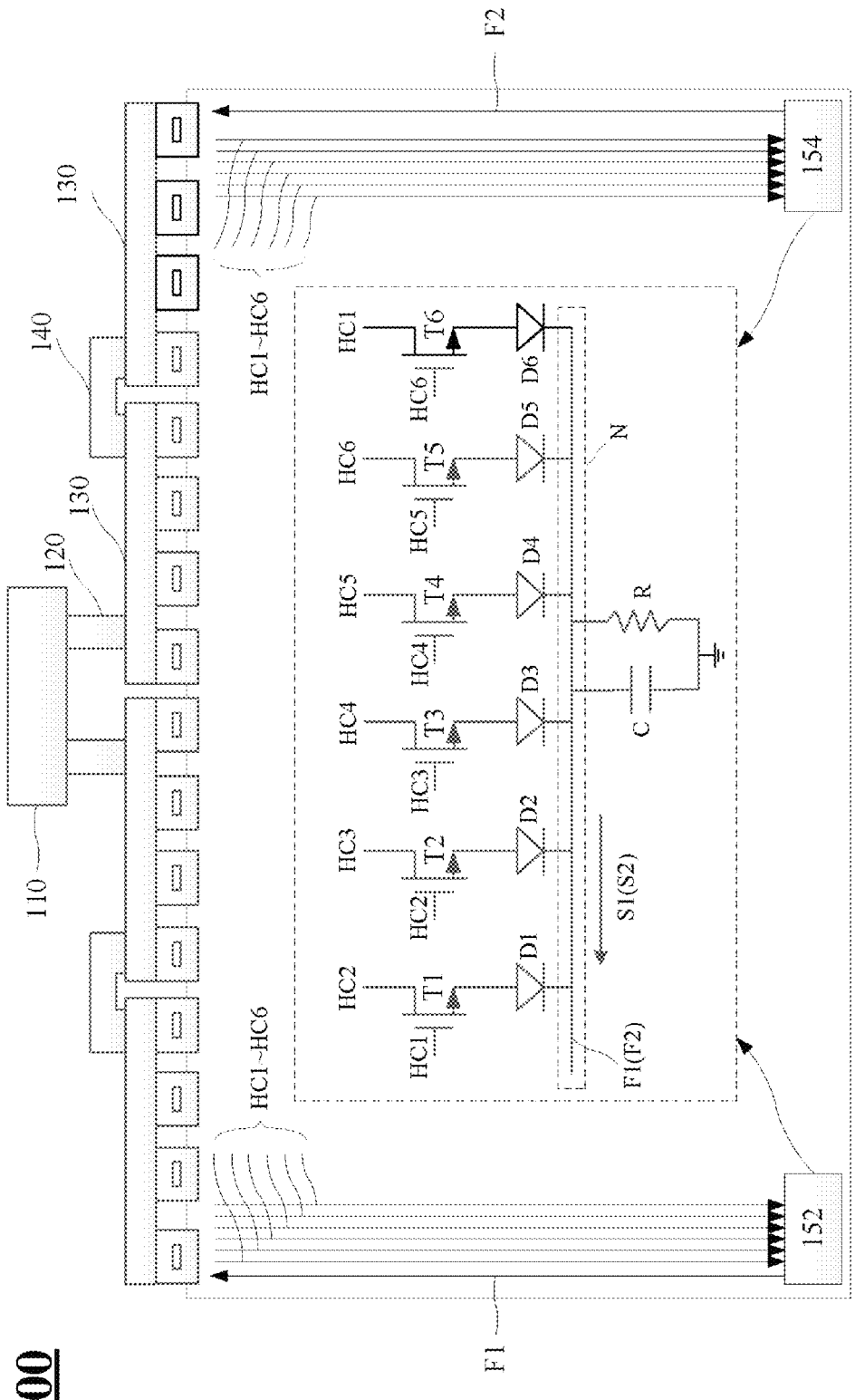
FIG. 1 is a schematic diagram of a display apparatus according to an embodiment of the present disclosure.

According to a commonly used operation mode, features and elements in the figures are not drawn to scale, and the drawing manner thereof is to present specific features and elements related to the present disclosure in an optimal manner. In addition, similar elements/components are denoted by same or similar reference numerals in different drawings.

DETAILED DESCRIPTION

To make the descriptions of the present disclosure more detailed and complete, the following provides illustrative descriptions of the implementation aspects and the specific embodiments of the present disclosure. However, this is not the only form for implementing or applying the specific embodiments of the present disclosure. The implementations cover features of multiple specific embodiments and method steps used to construct and operate these specific embodiments and a sequence of the steps. However, other specific embodiments may also be used to achieve a same or equivalent function and step sequence.

Unless otherwise defined in this specification, the meanings of scientific and technical terms used herein are the same as the meanings understood and commonly used by a person of ordinary skill in the art of the present disclosure. In addition, without being in conflict with the context, a singular noun used in this specification covers the plural form of the noun, and a used plural noun also covers the singular form of the noun.

In addition, as used herein, "coupled" may mean that two or more elements are either in direct physical or electrical contact, or that two or more elements are not in direct contact with each other but yet still co-operate or interact with each other.

FIG. 1 is a schematic diagram of a display apparatus according to an embodiment of the present disclosure. As shown in the figure, the display apparatus 100 includes a control board 110, a plurality of data signal boards 130, a protection circuit 152, a protection circuit 154, a plurality of clock signal lines HC1 to HC6, and feedback lines F1 and F2. The control board 110 is coupled to the data signal boards 130 by using a cable 120, and the data signal boards 130 are coupled to each other by using a cable 140. In addition, the control board 110 is disposed on a first side (for example, the upper side) of the display apparatus 100. The protection circuits 152 and 154 are disposed on a second side (for example, the lower side) of the display apparatus 100 opposite to the first side.

Figure 2:
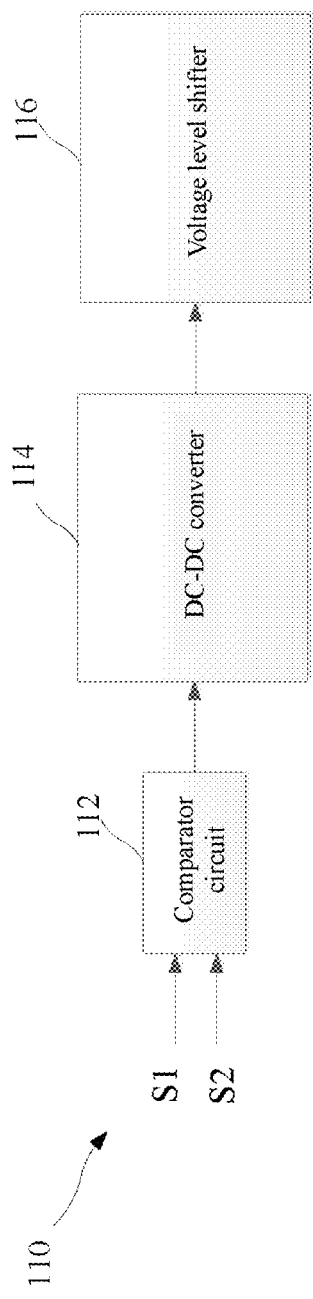
FIG. 2 is a schematic diagram of a detailed circuit of the display apparatus shown in FIG. 1 according to another embodiment of the present disclosure.
Figure 3:
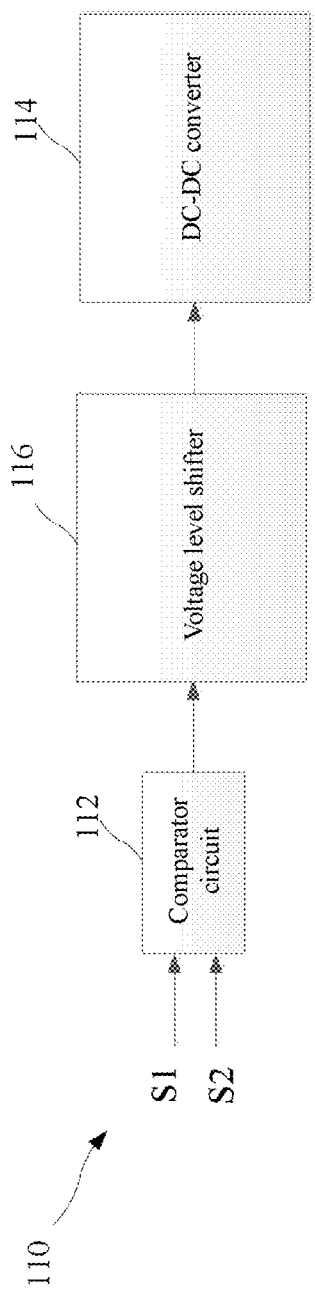
FIG. 3 is a schematic diagram of a detailed circuit of the display apparatus shown in FIG. 1 according to still another embodiment of the present disclosure.

In addition, referring to FIG. 2 and FIG. 3, FIG. 2 and FIG. 3 are schematic diagrams of detailed circuits of the display apparatus 100 shown in FIG. 1 according to another embodiment of the present disclosure. As shown in the figure, the control board 110 may include a comparator circuit 112, a DC-DC converter 114, and a voltage level shifter 116. In an embodiment, as shown in FIG. 2, the DC-DC converter 114 may be coupled between the comparator circuit 112 and the voltage level shifter 116. In another embodiment, as shown in FIG. 3, the voltage level shifter 116 may be coupled between the comparator circuit 112 and the DC-DC converter 114. However, the present disclosure is not limited to the foregoing embodiments. In other implementations, the voltage level shifter 116 and the comparator circuit 112 may be disposed on the data signal board 130, or disposed in a suitable position according to an actual design requirement.

Referring to FIG. 1 to FIG. 3 together, a first end (for example, the upper end) of each of the plurality of clock signal lines HC1 to HC6 is coupled to the voltage level shifter 116, while the protection circuits 152 and 154 are coupled to a second end (for example, the lower end) of each of the clock signal lines HC1 to HC6. If the clock signal lines HC1 to HC6 are short-circuited, the protection circuits 152 and 154 provide protection signals S1 and S2 for the comparator circuit 112 by using the feedback lines F1 and F2 respectively, and the comparator circuit 112 outputs a shutdown signal according to the protection signals S1 and S2, to turn off a power supply of the control board 110 or a power supply of the voltage level shifter 116 (for example, where the voltage level shifter may be disposed on the control board 110 or the data signal board 130). In an embodiment, the comparator circuit 112 is configured to compare levels of the protection signals S1 and S2. If the levels of the protection signals S1 and S2 are different, the comparator circuit 112 outputs the shutdown signal, to turn off the power supply of the control board 110 or the power supply of the voltage level shifter 116.

Referring to FIG. 1, the protection circuits 152 and 154 include a plurality of switches T1 to T6, and each of the switches T1 to T6 includes a control terminal, an input terminal, and an output terminal. Using the switch T1 as an example, a control terminal of the switch T1 is coupled to the first clock signal line HC1 in the clock signal lines HC1 to HC6. An input terminal of the switch T1 is coupled to the second clock signal line HC2 in the clock signal lines HC1 to HC6. For an output terminal of the switch T1, the control terminal determines, according to a first clock signal provided by the first clock signal line HC1, whether to conduct the input terminal and the output terminal, and the output terminal outputs a second clock signal provided by the second clock signal line HC2. Connection and operation manners of the other switches T2 to T6 are similar to those of the switch T1, and details are not described herein again. In addition, output terminals of the switches T1 to T6 are coupled to a node N.

Figure 4:
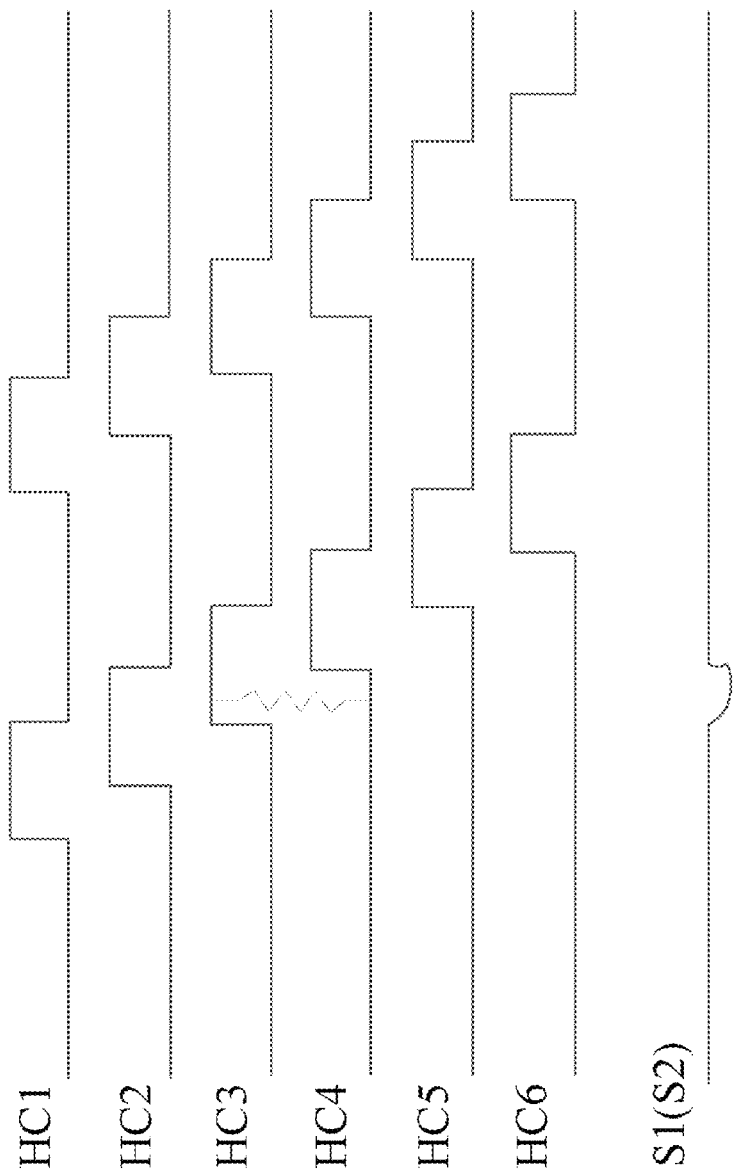
FIG. 4 is a schematic diagram of a signal waveform according to yet another embodiment of the present disclosure.

To describe operation manners of the protection circuits 152 and 154, referring to FIG. 4, FIG. 4 is a schematic diagram of a signal waveform according to another embodiment of the present disclosure. As shown in the figure, using the protection circuit 152 on the left side of the display apparatus 100 as an example, when the clock signal line HC3 and the clock signal line HC4 are short-circuited, a clock signal HC3 and a clock signal HC4 are pulled down as low-level signals, and the node N outputs the protection signal S1. For the protection circuit 154 on the right side of the display apparatus 100, when the clock signal line HC3 and the clock signal line HC4 are short-circuited, the clock signal HC3 and the clock signal HC4 are pulled down as low-level signals, and the node N outputs the protection signal S2.

In an embodiment, the first clock signal line HC1, the second clock signal line HC2, and the third clock signal line HC3 correspondingly and sequentially provide a high level of first clock signal, a high level of second clock signal, and a high level of third clock signal, the high level of first clock signal and the high level of second clock signal HC2 partially overlap, and the high level of second clock signal HC2 and the high level of third clock signal HC3 partially overlap. In addition, signal features of the clock signal lines HC4 to HC6 are similar to those of the clock signal lines HC1 to HC3, and details are not described herein again.

In another embodiment, the protection circuits 152 and 154 further include a plurality of diodes D1 to D6 and a capacitor-resistor unit RC. In terms of a connection relationship, each of the diodes D1 to D6 is correspondingly coupled between an output terminal of one of the switches T1 to T6 and the node N, and the capacitor-resistor unit RC is coupled between the node N and a grounding point. A capacitor C in the capacitor-resistor unit RC is used as a voltage regulator, and a magnitude of a resistor R may be adjusted according to an actual requirement, to adjust magnitudes of the protection signals S1 and S2.

Referring to FIG. 2, it is assumed that the left side of the display apparatus 100 is short-circuited while the right side is in a normal state. In this case, the protection circuit 152 outputs a low level of protection signal S1. On the contrary, because the right side is in the normal state, in this case, the protection circuit 154 outputs a high level of protection signal S2. Subsequently, the comparator circuit 112 is configured to compare the protection signals S1 and S2 respectively output by the protection circuits 152 and 154. If the comparator circuit 112 obtains through comparison that the levels of the protection signals S1 and S2 are different, the comparator circuit 112 outputs a shutdown signal, to turn off the DC-DC converter 114 on the control board 110, and further turn off the power supply of the control board 110. In the embodiment, a protection point does not need to be set for the display apparatus 100, it compares the levels of the protection signals S1 and S2.

Referring to FIG. 3, a difference between FIG. 3 and FIG. 2 lies in that the shutdown signal output by the comparator circuit 112 is provided for the voltage level shifter 116. Similarly, it is assumed that the left side of the display apparatus 100 is short-circuited while the right side is in a normal state. In this case, the protection circuit 152 outputs a low level of protection signal S1, and the protection circuit 154 outputs a high level of protection signal S2. Subsequently, when the comparator circuit 112 obtains through comparison that the levels of the protection signals S1 and S2 are different, the comparator circuit 112 outputs a shutdown signal to the voltage level shifter 116, to turn off the power supply of the control board 110. In the embodiment, a protection point does not need to be set for the display apparatus 100, it compares the levels of the protection signals S1 and S2.

Figure 5:
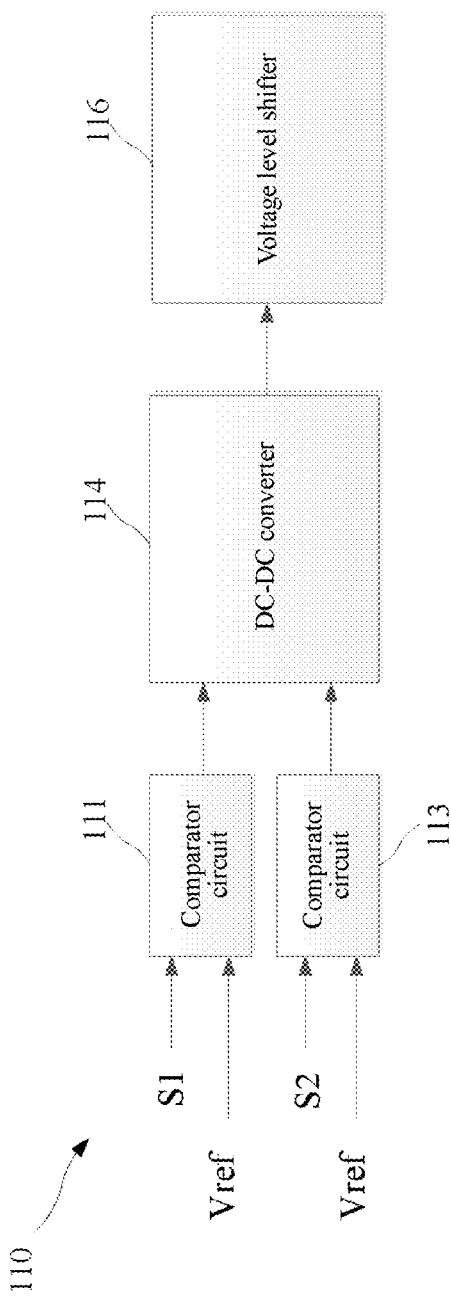
FIG. 5 is a schematic diagram of a detailed circuit of the display apparatus shown in FIG. 1 according to another embodiment of the present disclosure.

In the other embodiments, the display apparatus 100 may be implemented by using two comparator circuits. Referring to FIG. 5, FIG. 5 is a schematic diagram of a detailed circuit of the display apparatus 100 shown in FIG. 1 according to yet another embodiment of the present disclosure. As shown in the figure, the display apparatus 100 includes comparator circuits 111 and 113. The comparator circuit 111 is configured to compare the protection signal S1 with a reference signal Vref. In other word, the reference signal Vref can be a protection point. If the level of the protection signal S1 is lower than a level of the reference signal Vref, the comparator circuit 111 outputs a shutdown signal, to turn off the DC-DC converter 114 on the control board 110, and further turn off the power supply of the control board 110. Similarly, the comparator circuit 113 is configured to compare the protection signal S2 with the reference signal Vref. If the level of the protection signal S2 is lower than the level of the reference signal Vref, the comparator circuit 113 outputs a shutdown signal, to turn off the DC-DC converter 114 on the control board 110, and further turn off the power supply of the control board 110.

Figure 6:
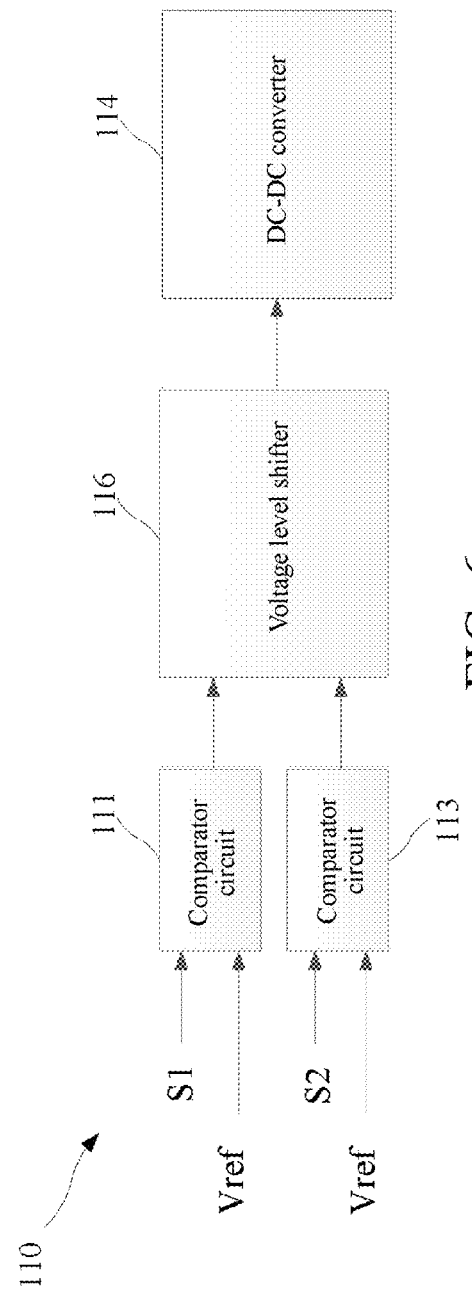
FIG. 6 is a schematic diagram of a detailed circuit of the display apparatus shown in FIG. 1 according to still another embodiment of the present disclosure.

Referring to FIG. 6, a difference between FIG. 6 and FIG. 5 lies in that the shutdown signals output by the comparator circuits 111 and 113 are provided for the voltage level shifter 116. Similarly, the comparator circuit 111 is configured to compare the protection signal S1 with the reference signal Vref. If the level of the protection signal S1 is lower than the level of the reference signal Vref, the comparator circuit 111 outputs a shutdown signal to the voltage level shifter 116, to turn off the power supply of the control board 110. In addition, the comparator circuit 113 is configured to compare the protection signal S2 with the reference signal Vref. If the level of the protection signal S2 is lower than the level of the reference signal Vref, the comparator circuit 113 outputs a shutdown signal to the voltage level shifter 116, to turn off the power supply of the control board 110.

In this way, the display apparatus 100 herein can output the protection signals S1 and S2 to the control board 110 in real time according to settings of the protection circuits 152 and 154 when a short-circuit occurs, thereby enabling a short-circuit mechanism to turn off a power supply of the display apparatus 100, and preventing a component in the display apparatus 100 from being burned because of overheating. The display apparatus 100 can enable a short circuit protection mechanism according to the sensing result by the protection circuits 152 and 154, whether a short-circuit occurs on the left side and the right side of the display apparatus 100. Compared with conventional short circuit protection applied to a display apparatus, the protection circuits 152 and 154 of the display apparatus 100 may be disposed in the surface of the display apparatus. In this way, a short-circuit that occurs in the surface can be detected without being affected by trace impedance, and a signal is detected, by using the feedback lines F1 and F2, to the control board 110 or the data signal board 130 as a basis for whether to enable protection.

It can be learned from the foregoing implementations of the present disclosure that the present disclosure has the following advantages. The embodiments of the present disclosure provide a display apparatus and a protection circuit thereof, so as to mitigate a problem that when the SCP solution is applied to the display apparatus, the protection mechanism cannot be effectively started due to trace impedance, and mitigate a problem that when the current limiting resistor solution is applied to the display apparatus, because resistance of the current limiting resistor is relatively large, a signal is easily affected and current limiting cannot be effectively performed. Furthermore, the embodiments of the present disclosure can enable the protection mechanism by using of two feedback lines and does not need detect all the signal lines.

The specific embodiments of the present disclosure are disclosed in the foregoing implementations. However, these implementations are not intended to limit the present disclosure. Various changes and modifications made by persons of ordinary skill in the art of the present disclosure without departing from the principle and spirit of the present disclosure shall fall within the protection scope of the present disclosure. The protection scope of the present disclosure is subject to the appended claims.

What is claimed is:

1. A protection circuit, applied to a display apparatus, wherein the display apparatus comprises a voltage level shifter and a plurality of clock signal lines coupled to the voltage level shifter, wherein the protection circuit comprises:
a first switch and a second switch, wherein the first switch comprises:
a first control terminal, coupled to a first clock signal line of the plurality of the clock signal lines receiving a first clock signal;
a first input terminal, coupled to a second clock signal line of the plurality of the clock signal lines for receiving a second clock signal; and
a first output terminal;
wherein the first control terminal determines whether to conduct the first input terminal and the first output terminal for outputting the second clock signal according to a first clock signal; and
wherein the first output terminal is coupled to a node, and when the first clock signal line and the second clock signal line are short-circuited, the first clock signal and the second clock signal are pulled down as low-level signals, and the node outputs a protection signal.

2. The protection circuit according to claim 1, wherein the second switch comprises:

a second control terminal, coupled to the second clock signal line for receiving the second clock signal;
a second input terminal, coupled to a third clock signal line of the plurality of the clock signal lines for receiving a third clock signal; and
a second output terminal;
wherein the second control terminal determines whether to conduct the second input terminal and the second output terminal for outputting the third clock signal according to the second clock signal; and
wherein the second output terminal is coupled to the node, and when the second clock signal line and the third clock signal lines are short-circuited, the second and the third clock signal are pulled down as low-level signals, and the node outputs the protection signal.

3. The protection circuit according to claim 2, wherein the first clock signal line, the second clock signal line, and the third clock signal line correspondingly and sequentially provide first clock signal at a high level, second clock signal at the high level, and third clock signal at the high level; and
wherein first clock signal at the high level and second clock signal at the high level partially overlap, and second clock signal at the high level and the third clock signal at the high level partially overlap.

4. The protection circuit according to claim 3, wherein the node outputs node clock signal at a low level as the protection signal when any of the clock signal lines is short-circuited, otherwise the node outputs node clock signal at the high level.

5. The protection circuit according to claim 1, further comprising:
a diode, coupled between the first output terminal and the node; and
a capacitor-resistor unit, coupled between the node and a grounding point.

6. A display apparatus, comprising:
a control board, disposed on a first side of the display apparatus;
a voltage level shifter, disposed on the first side of the display apparatus;
a plurality of clock signal lines, wherein a first end of each of the clock signal lines is coupled to the voltage level shifter;
a first protection circuit, disposed on a second side of the display apparatus opposite to the first side, and coupled to a second end of each of the clock signal lines, where the protection circuit comprises a first switch and a second switch, wherein the first switch comprises:
a first control terminal, coupled to a first clock signal line of the plurality of the clock signal lines receiving a first clock signal;
a first input terminal, coupled to a second clock signal line of the plurality of the clock signal lines for receiving a second clock signal; and
a first output terminal;
wherein the first control terminal determines whether to conduct the first input terminal and the first output terminal for outputting the second clock signal according to a first clock signal; and
wherein the first output terminal is coupled to a node, and when the first clock signal line and the second clock signal line are short-circuited, the first clock signal and the second clock signal are pulled down as low-level signals, and the node outputs a protection signal; and
a first comparator circuit, wherein when the clock signal lines are short-circuited, the protection circuit provides a protection signal for the first comparator circuit by using a feedback line, and the comparator circuit outputs a shutdown signal according to the protection signal, to turn off a power supply of the control board or a power supply of the voltage level shifter.

7. The display apparatus according to claim 6, wherein the comparator circuit compares the protection signal with a reference signal, and if the protection signal is lower than the reference signal, the first comparator circuit outputs the shutdown signal to turn off the power supply of the control board or the power supply of the voltage level shifter.

8. The display apparatus according to claim 6, further comprising a second protection circuit, wherein:
a first protection circuit is disposed on a first end of the second side of the display apparatus, wherein when one of the clock signal lines coupled to the first protection circuit is short-circuited, the first protection circuit outputs a first protection signal; and
a second protection circuit is disposed on a second end of the second side of the display apparatus opposite to the first end, wherein when one of the clock signal lines coupled to the second protection circuit is short-circuited, the second protection circuit outputs a second protection signal.

9. The display apparatus according to claim 8, wherein the first comparator circuit compares the first protection signal with the second protection signal, and if the first protection signal is different from the second protection signal, the first comparator circuit outputs the shutdown signal to turn off the power supply of the control board or the power supply of the voltage level shifter.

10. The display apparatus according to claim 8, further comprises a second comparator circuit, wherein:
a first comparator circuit compares the first protection signal with the reference signal, and if the first protection signal is lower than the reference signal, the first comparator circuit outputs the shutdown signal to turn off the power supply of the control board or the power supply of the voltage level shifter; and
a second comparator circuit compares the second protection signal with the reference signal, and if the second protection signal is lower than the reference signal, the second comparator circuit outputs the shutdown signal to turn off the power supply of the control board or the power supply of the voltage level shifter.

* * * * *